United States Patent
Bothra

(10) Patent No.: US 6,472,253 B1
(45) Date of Patent: Oct. 29, 2002

(54) PROGRAMMABLE SEMICONDUCTOR DEVICE STRUCTURES AND METHODS FOR MAKING THE SAME

(75) Inventor: Subhas Bothra, Fremont, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/440,103

(22) Filed: Nov. 15, 1999

(51) Int. Cl.$^7$ ............................................... H01L 21/82
(52) U.S. Cl. ...................................... 438/131; 430/130
(58) Field of Search ................................ 438/128, 130, 438/131, 132

(56) References Cited

U.S. PATENT DOCUMENTS

| 5,648,826 A | * | 7/1997 | Song et al. ................... 349/49 |
| 5,928,968 A | | 7/1999 | Bothra et al. ............... 438/754 |
| 6,261,937 B1 | * | 7/2001 | Tobben et al. .............. 438/601 |

FOREIGN PATENT DOCUMENTS

EP          0256494          2/1988

OTHER PUBLICATIONS

Anonymous, "Collapsible Bonding Structure for Engineering Change and Personalized Connections", May 12, 1992, IBM Technical Disclosure Bulletin, US, vol. 34, No. 12, pp. 276–278.

* cited by examiner

Primary Examiner—Trung Dang
Assistant Examiner—William M. Brewster

(57) ABSTRACT

A programmable device and methods for making the programmable device are provided. The programmable device includes a link metallization line with an oxide layer defined above the link metallization line. A via hole is patterned in the oxide layer which defines a path to the link metallization line. A programming metallization line is defined over the oxide layer. The programming metallization line has an overlap portion that lies over the via hole. The overlap portion is configured to melt into the via hole to define a programming link between the link metallization line and the programming metallization line. In one example, the melting is accomplished by implementing a laser that can direct laser energy toward a desired programmable device to achieve the desired programming.

12 Claims, 13 Drawing Sheets

PROGRAMMABLE SEMICONDUCTOR DEVICE STRUCTURES AND METHODS FOR MAKING THE SAME

BACKGROUND OF THE INVENTION

1. Field of the Invention

The present invention relates to the programming of devices of semiconductor chips, and more particularly, to the forming of programmable devices and the selective programming of such devices.

2. Description of the Related Art

Recently, there have been many advances in the fabrication of semiconductor devices, which have led to the continued development of smaller and smaller semiconductor chips. Due to these advances, miniature chips are finding a number of new applications. Such applications include, for example, automated teller machine (ATM) cards, identification cards, security access cards, set-top boxes, cellular phones, and the like. Integrated chips bring these type of applications substantially more intelligence than was previously possible with magnetic strips and other static data storage. Applications such as these, however, require chips that can be programmed with specific passwords, programs, or codes in order to store information that is either unique to the user, or specific to the chip.

Traditionally, the manufacturer of the chip may be required to program codes or set wiring after the chip is packaged using laser fuse technology or before packaging using antifuse technology. As is well known to those skilled in the art, laser fuse technology requires that a fuse structure (that is in the form of a metal line) be blown apart to prevent future electrical conduction. Although fuse technology is capable of providing programmability, a polysilicon-type fuse (which is most common), necessarily prevents a certain amount of chip area from being used for active circuitry. Typically, fuses that utilize a laser for obliteration need to be placed sufficiently away from active circuitry because of the potential for collateral damage to other circuit elements from the laser pulse or by subsequent damage associated with damage to the passivation and inter-metal oxides (IMO) layers at the fuse locations. Additionally, fuses that require laser obliteration need to adhere to specific spacing requirements to ensure that there is no thermal coupling between devices or inadvertent programming of other fuses.

Antifuse technology, on the other hand, defines a link between two metal layers by forming links through an amorphous silicon layer. As can be appreciated, implementing antifuse structures into a custom chip design requires a number of special fabrication operations to make the antifuse structures. In addition, some antifuse structures require even more chip area than fuses. More importantly, the programming of antifuses requires that enough current is passed between two metal layers to create a silicided link between the selected metal lines. Although antifuse technology can be used, it is also known to be somewhat unreliable. That is, fuses that appear programmed at one point in the chip's operational life may become de-programmed unexpectedly. Most importantly, the fabrication of a limited number of antifuse devices onto an application specific integrated circuit (ASIC) may drive the cost of fabrication too high to make the chip practical for certain consumer applications.

FIG. 1A describes yet another technique for forming a conductive link in accordance with the prior art. FIG. 1A illustrates heating a metallization line 20 to form cracks 22a–22d in a semiconductor device 11. The cracks 22a–22d will ultimately serve to connect the metallization line 20 with a metallization line 18. FIG. 1A shows the metallization line 20 being subjected to a high energy heat source, such as laser energy 32 from a laser 30. As the metallization line 20 begins to melt, it expands causing the cracks 22 to form throughout the semiconductor device 11 as shown. As the cracks 22 propagate, crack formation lines 22a, 22b, 22c and 22d form. Eventually, the crack line 22c propagates through oxide layer 14 to the metallization line 18. As the metallization line 20 melts, it seeps into crack line 22c. The metallization line 20 continues to seep through the path defined by the crack 22c until it comes into contact with the metallization line 18. Thus, a conductive link is formed through the crack 22c whereby the metallization line 20 is in conductive contact with the metallization line 18.

The technique used in the prior art as shown in FIG. 1A has many drawbacks. As the metallization line 20 expands, large stresses in the metal/dielectric around the metallization line build up and cracking around the corners usually results. Furthermore, the cracks themselves are difficult to control, thereby making this technique unreliable. Also, the mere existence of the cracks pose a reliability problem. These disadvantages render the technique undesirable.

In view of the foregoing, there is a need for a method of making a programmable structure, which can be cost effectively fabricated and is capable of being compactly designed into any type of integrated circuit structure. There is also a need for programmable structures that do not occupy chip area that needs to be used for active devices and do not cause damage to neighboring devices when programmed. Additionally, the method for making the programmable structure must not create cracks and unduly stress the semiconductor device.

SUMMARY OF THE INVENTION

Broadly speaking, the present invention fills these needs by providing a programmable structure that can be laser programmed to form a hard-wired link, and methods for making the programmable structure. It should be appreciated that the present invention can be implemented in numerous ways, including as a process, an apparatus, a system, a device, or a method. Several inventive embodiments of the present invention are described below.

In one embodiment, a programmable device is disclosed. The programmable device includes a link metallization line and a via hole that is defined in an oxide layer that is above the link metallization line. The via hole defines a path to the link metallization line. A programming metallization line is patterned over the oxide layer and the programming metallization line has an overlap portion which lies over the via hole. The overlap portion is configured to melt into the via hole to define a programming link between the link metallization line and the programing metallization line.

In another embodiment, a method for making a programmable device is disclosed. A link metallization line is formed with an oxide layer deposited over the link metallization line. Next, a conductive via is defined within the oxide layer which is in communication with the link metallization line. A programing metallization line is then patterned over the oxide layer such that an overlap portion of the programming metallization line lies over the conductive via. The conductive material is subsequently removed from the conductive via to define a via hole that forms a path between the programming metallization line and the link metallization line. Once the conductive material is removed, part of the overlap portion of the programming metallization line is melted into the via hole to define a programming link. The programming link connects the link metallization line to the programming metallization line.

In yet a further embodiment, another method for making a programmable device is disclosed. A link metallization line is formed with an oxide layer over the link metallization line. A conductive via is then formed in the oxide layer that is in communication with the link metallization line. After the conductive via is formed, a programmable metallization line is patterned over the oxide layer to define an overlap portion of the programmable metallization line. The overlap portion is defined to at least partially overlap the conductive via. Next, a conductive material within the conductive via is removed to define a via hole which creates a path between the programming metallization lines and the link metallization line. A second oxide layer is then formed over the programmable metallization layer. Once the second oxide layer is formed, a nitride layer is deposited over the oxide layer. The nitride layer and the second oxide layer are subsequently etched to form a laser contact location over the programmable metallization line and the via hole. Heat energy is then applied to the laser contact location to melt part of the overlap portion of the programmable metallization layer into the via hole. During melting, the overlap portion comes into contact with the link metallization layer to form a programmable link.

The many advantages of the current invention should be recognized. The current invention allows for a more controlled manner of programming a semiconductor device. The via hole avoids the problem of stressing in the semiconductor device and cracking in the dielectric surrounding the programmable line. The via hole allows a path for which a portion of the programmable metallization lines may expand.

The present invention has the further advantage of forming a hard-wire link between the programmable metallization line and the link metallization line. The hard-wire link is not capable of becoming deprogrammed as is the case with traditional anti-fuse programming. An additional advantage of the present invention is, no further fabrication operations are required for making the programmable device, other than standard interconnect metallization fabrication.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

FIG. 3B—2 is a top view of one embodiment of the present invention.

DETAILED DESCRIPTION OF THE PREFERRED EMBODIMENTS

An invention for a programmable structure that can be laser programmed to form a hard-wired link, and methods for making the programmable structure are disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In accordance with the present invention, a programmable structure which can be efficiently integrated into an integrated circuit chip is disclosed. The structure is preferably defined between interconnect metallization lines of a device. That is, the programmable structure is initially formed by selecting particular tungsten via plugs to be removed to define one or more via holes that no longer have conductive material interconnecting associated upper and lower metallization lines. The vias that were selectively cleaned of tungsten material may then be selected for programming, if desired.

Initially, the following discussion will address the technique for selectively removing tungsten from via holes lying between two metallization lines and then followed by a discussion on the techniques used to make programmable structures.

Figure 1A:
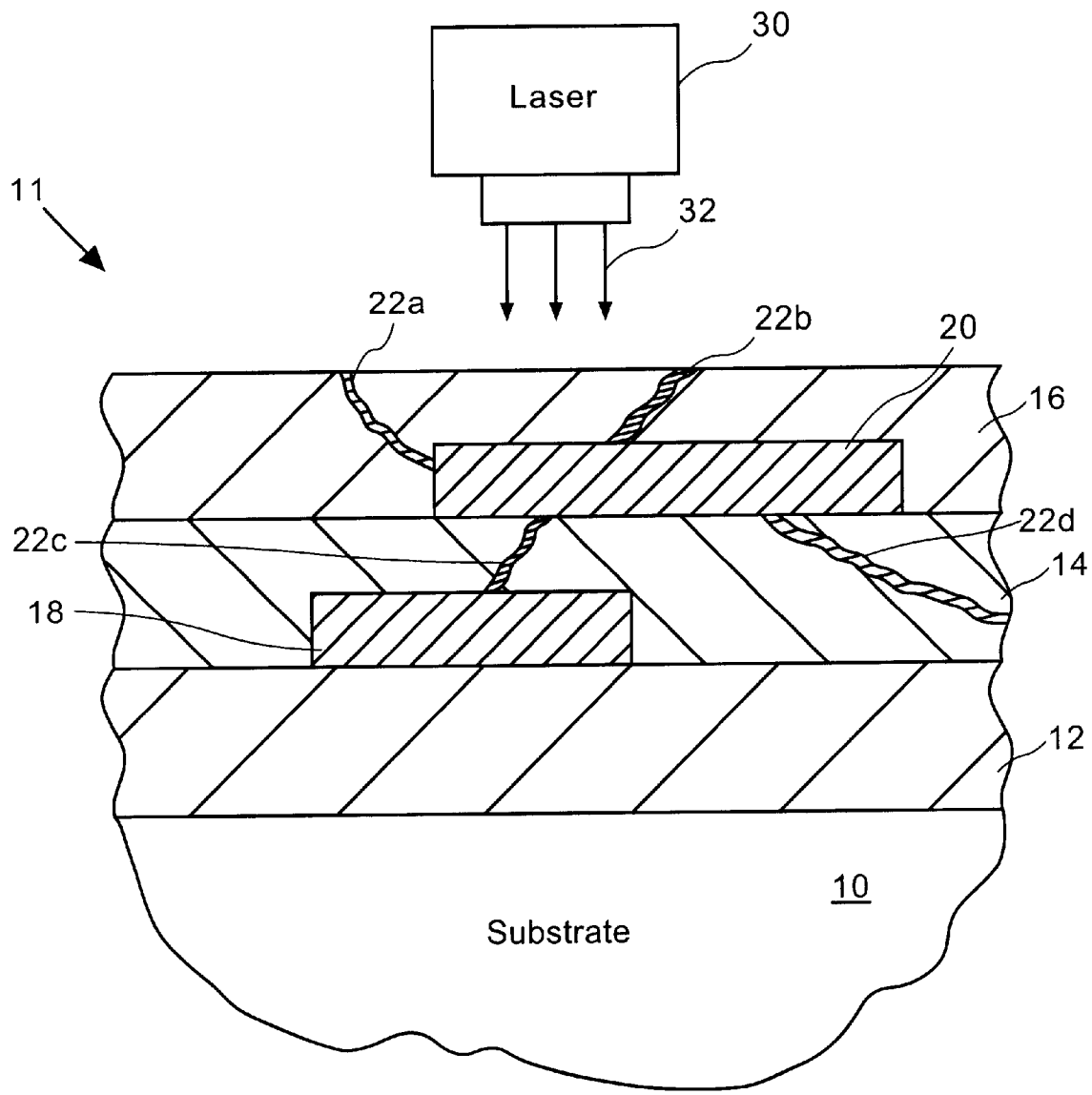
FIG. 1A illustrates heating a metallization line to form cracks in a semiconductor device which interconnect metallization lines.
Figure 1B:
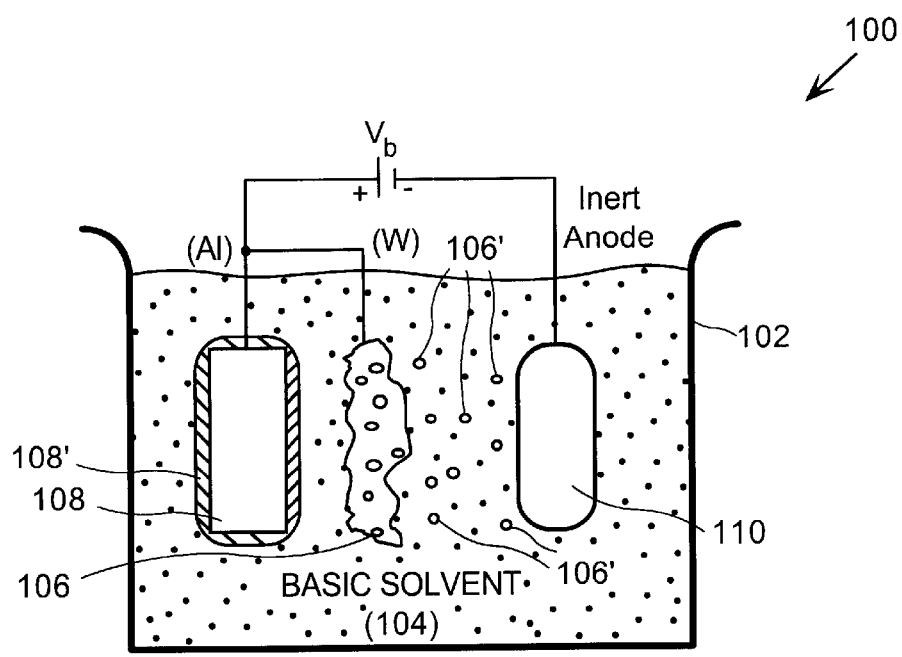
FIG. 1B shows a chemical reaction system having an aluminum electrode and a tungsten electrode submerged in a basic solution in accordance with one embodiment of the present invention.

FIG. 1B shows a chemical reaction system 100 having an aluminum electrode 108 and a tungsten electrode 106 submerged in a basic solution 104 in accordance with one embodiment of the present invention. In this example, both the aluminum electrode 108 and the tungsten electrode 106 are coupled to a positive bias voltage $V_b$, and a negative electrode 110 is coupled to a negative terminal of the bias voltage $V_b$. The basic solvent 104 is preferably an electrolyte that preferably has a pH level that is greater than 7, and more preferably is greater than about 8, and most preferably is greater than about 10.

Although a chemical reaction between the aluminum electrode 108 and the basic solvent 104, and the tungsten electrode 106 and the basic solvent 104 will naturally occur without the application of a bias voltage $V_b$, the chemical reaction in the basic solvent 104 may be accelerated by applying the bias voltage $V_b$. For example, when the bias voltage $V_b$ is applied between the two electrodes, the tungsten electrode 106 will rapidly begin to erode by reacting with the basic solvent 104. This reaction produces tungsten oxide $WO_3$ 106' which rapidly dissolves in lightly basic solutions. Once the reaction begins, the tungsten will continue to oxidize until the tungsten electrode 106 is completely eroded.

In contrast however, the aluminum electrode 108 will not erode in the basic solvent 104, but will form an aluminum oxide passivation layer 108'. Because standard CMOS circuit fabrication processes utilize aluminum interconnect lines and tungsten plugs to interconnect the aluminum lines of the various levels, it is possible to simultaneously manufacture a programmable structure during the standard CMOS circuit fabrication process.

By way of example, when an interconnect layer is designed, a non-filled via of a programmable structure of the present invention may be simultaneously designed into that layer by allowing a portion of a tungsten plug to be exposed, before the semiconductor structure (i.e., the wafer) is submerged into a basic solvent that is commonly used to remove polymers after a metallization etching operation. An embodiment of this technique will now be described in greater detail with reference to FIGS. 2A through 2D.

Figure 2A:
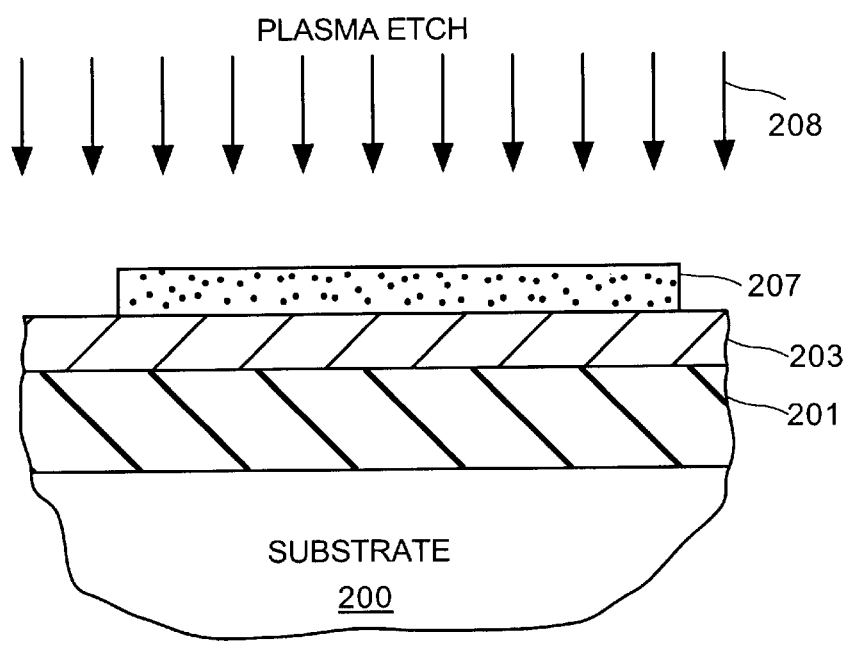
FIG. 2A shows a cross-sectional view of a partially fabricated semiconductor structure that is formed over a substrate in accordance with one embodiment of the present invention.

FIG. 2A shows a cross-sectional view of a partially fabricated semiconductor structure that is formed over a substrate 200 in accordance with one embodiment of the present invention. In an initial operation, an inter-metal oxide 201 is formed over the substrate 200, and then a metallization layer 203 is sputtered over the inter-metal oxide layer 201. In order to pattern the metallization layer 203, a photoresist mask 207 is formed over the metallization layer 203. As is well known, the photoresist mask 207 may be patterned using any number of well known techniques, including conventional photolithography.

Once the photoresist mask 207 has been formed, a plasma etching operation 208 is performed to remove the metallization layer 203 that is not covered by the photoresist mask 207. Although any plasma etcher may be used, one exemplary plasma etcher is a Lam Research TCP 9600 SE etcher, that is available from Lam Research of Fremont, Calif. In this embodiment, the plasma etcher is configured to negatively charge the substrate 200 to a negative potential, and the floating metallization layers that are not electrically connected to the substrate 200 (ie., through conductive via structures) to a positive potential.

Figure 2B:
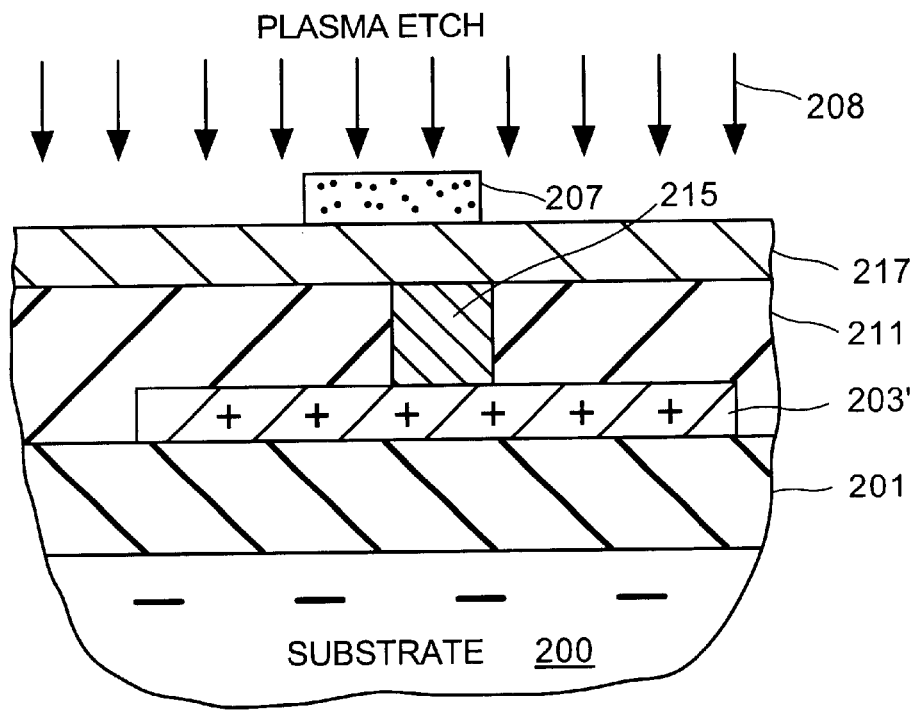
FIG. 2B shows a cross-sectional view of a semiconductor structure after a number of layers are fabricated over an inter-metal oxide layer and a patterned metallization layer in accordance with one embodiment of the present invention.
Figure 2C:
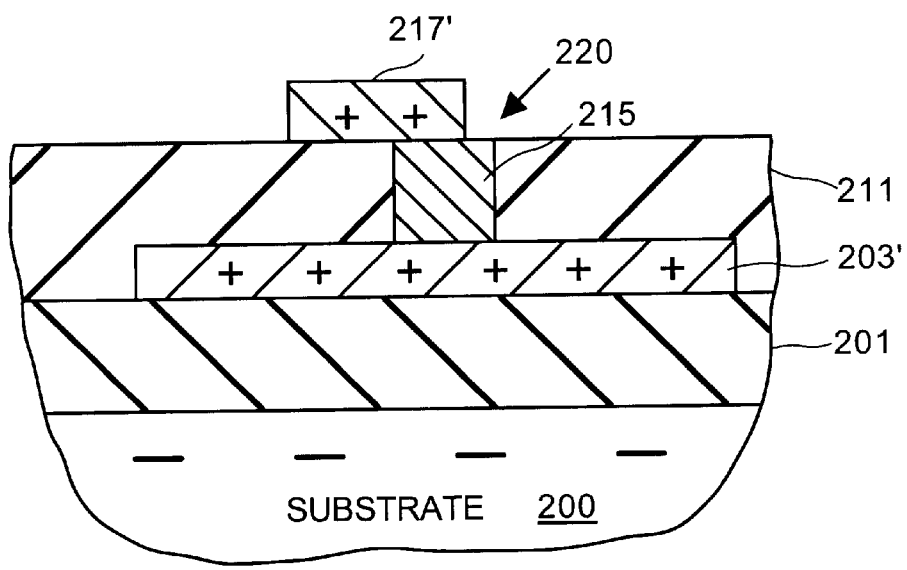
FIG. 2C shows the cross-sectional view of FIG. 2B after a top metallization layer is etched in a plasma etcher in accordance with one embodiment of the present invention.

FIG. 2B shows a cross-sectional view of the semiconductor structure of FIG. 2A after a number of layers are fabricated over the inter-metal oxide layer 201 and a patterned metallization layer 203' in accordance with one embodiment of the present invention. As pictorially shown, the patterned metallization layer 203' was charged to a positive (+) potential, and is a floating structure that is not connected to a diffusion or gate of the substrate 200. In this example, an inter-metal oxide layer 211 was formed over the patterned metallization layer 203', and a tungsten plug 215 was formed within a via that was etched into the inter-metal oxide layer 211.

After the tungsten plug 215 is formed into the inter-metal oxide layer 211, a metallization layer 217 is sputtered over the inter-metal oxide layer 211 and the tungsten plug 215. In order to pattern the metallization layer 217, a photoresist mask 207 is defined over the metallization layer 217. In this embodiment, the photoresist mask 207 is patterned such that at least a portion of the tungsten plug 215 is exposed once the metallization layer 217 is etched. Therefore, once the plasma etch operation 208 is performed, the structure of FIG. 2C will result. As shown, a patterned metallization layer 217' will now lie over the inter-metal oxide layer 211, and over substantially all of the tungsten plug 215. However, at least one gap 220 of any suitable shape will expose a portion of the underlying tungsten plug 215. After the etching operations are complete, a charge "Q" that is equivalent to the capacitance "C" of the patterned metallization layers 203' and 217' multiplied by the induced plasma voltage during the plasma etching of the metal is produced (i.e., Q=C*V).

Figure 2D:
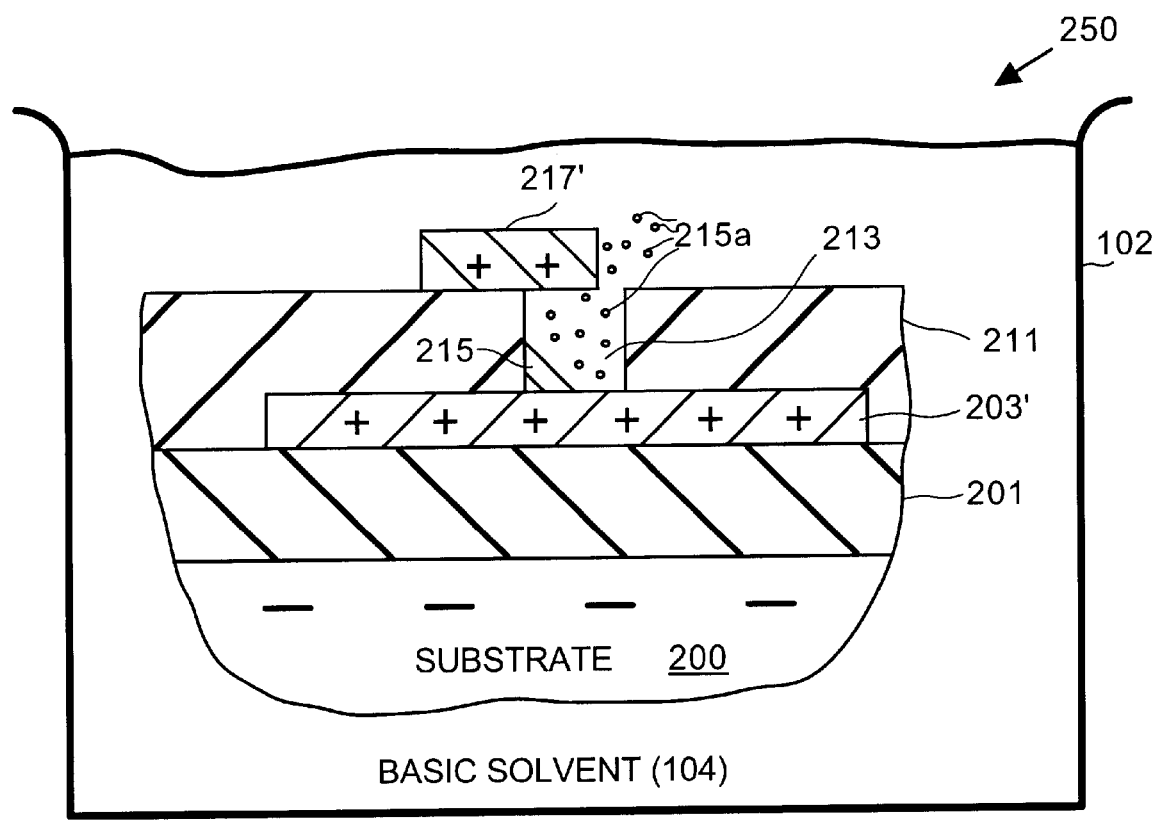
FIG. 2D shows a polymer removal system in which a fabricated substrate is submerged in a basic solvent in accordance with one embodiment of the present invention.

FIG. 2D shows a polymer removal system 250, in which a fabricated substrate 200 is submerged in a basic solvent 104 in accordance with one embodiment of the present invention. Because the fabricated substrate 200 is usually submerged in a container 102 that contains the basic solvent 104 during standard CMOS polymer removal operations, it is advantageously possible to simultaneously fabricate the via hole 213 of the programmable structure during these operations. That is, the polymer removal system 250 is generally used as a standard operation after a plasma operation, and therefore, by strategically patterning metallization materials over selected tungsten plugs, it will be possible to form programmable structures in any desired region of the integrated circuit chip, thus using up less chip area.

Therefore, by ensuring that the via hole desired to be eroded is not electrically connected to the negatively charged substrate 200, and by patterning the overlying metallization to ensure that a gap exposes a tungsten plug to a basic solvent having a pH level that is greater than 7, it is possible to efficiently fabricate the via holes of the programmable structures.

In this example, because the patterned metallization layer 217' and the patterned metallization layer 203' are not in electrical contact with the substrate 200 that is negatively charged, the chemical reaction described with reference to FIG. 1 will naturally occur. That is, the tungsten plug material 215 will immediately begin to erode and be converted to tungsten oxide ions 215a. As a result, the tungsten plug material 215 will be completely removed, thereby creating a clean via hole 213. In one embodiment, the erosion of the tungsten material will generally occur so long as the charge Q of the metal capacitor divided by $1.6 \times 10^{-19}$ is greater than the number of tungsten atoms in the via plug (i.e., $Q/1.6 \times 10^{-19} >$ W atoms in plug). For more information on the formation of voided via holes, reference can be made to U.S. Pat. No. 5,928,968, entitled "Semiconductor Pressure Transducer Structures and Methods for Making the Same," filed on Dec. 22, 1997, and issued on Jul. 27, 1999. This U.S. Patent is hereby incorporated by reference.

Figure 3A:
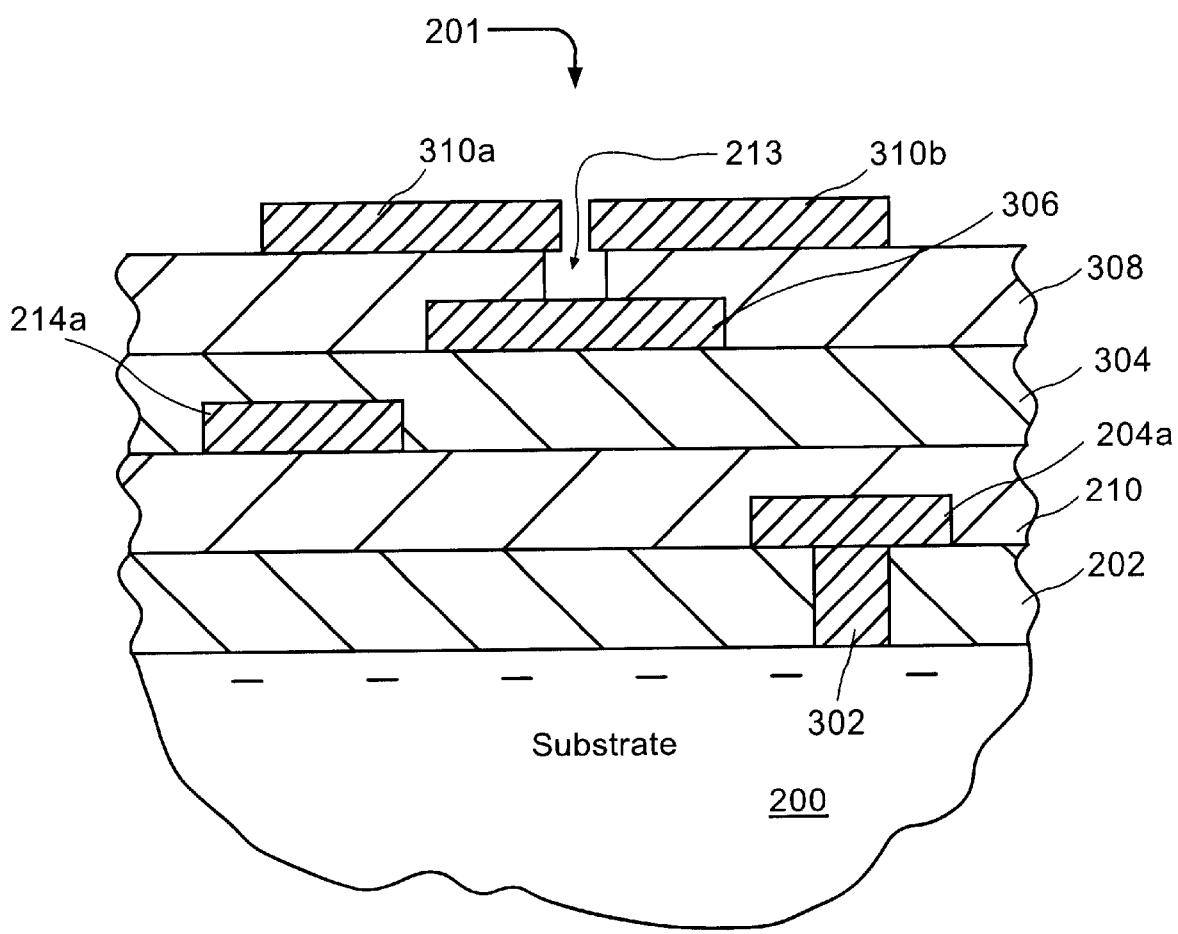
FIG. 3A is a cross-sectional view of a semiconductor device with various metal lines including a link metallization line and programming metallization lines in accordance with one embodiment of the present invention.

FIG. 3A is a cross-sectional view of a semiconductor device 201 with various metal lines including a link metallization line 306 and programming metallization lines 310a and 310b in accordance with one embodiment of the present invention. The substrate 200 has an oxide layer 202 formed thereon, and a conductive via 302 defined down to the substrate 200 (e.g., for making contact to diffusion regions or transistor gates). A metallization line 204a is then formed over the oxide layer 202, and the metallization line 204a is defined on metallization layer M1. An oxide layer 210 is then formed over the M1 before a metallization line 214a is formed from a metallization layer M2. An oxide layer 304 is also shown formed over the metallization line 214a. The link metallization line 306, oxide layer 308 and the programming metallization lines 310a and 310b are formed using the techniques previously described with reference to FIGS. 2A–2C.

The link metallization line 306 and the programming metallization lines 310a and 310b become positively charged during a plasma etch operation (not shown) used to pattern the metallization material. In one embodiment, the programming metallization lines 310a and 310b are formed such that a gap is defined between them to allow a path to a via hole 213. The via hole 213 is formed using the techniques previously described with reference to FIGS. 2A–2D. In this embodiment, the programming metallization lines 310a and 310b are deposited to a thickness ranging between about 4000 Angstroms and about 20000 Angstroms, and most preferably about 8000 Angstroms. The programming metallization lines 310 and the link metallization line 306 are preferably made of aluminum containing a small amount of copper. However, other suitable conductive materials used in interconnect technology may also work. As will be described below in greater detail, the programming metallization lines 310 will be subjected to laser energy in order to melt the metallization material into the via hole 213 when programming is desired.

In one embodiment, the programming metallization lines 310a and 310b may be patterned to increase the peripheral surface area in order to improve the charging capabilities of the metallization lines 310a and 310b during the etching operation described with reference to FIG. 2B. FIGS. 3B—1 and 3B—2 are top views showing two embodiments of the programming metallization lines. In FIG. 3B—1, the metallization lines 310'a and 310'b are configured in an opposing fork arrangement. For example, the metallization lines 310'a and 310'b are patterned in the shape of fingers arranged in the opposing fork pattern. The fingers oppose one another and increase the peripheral surface of the programming metallization lines 310'a and 310'b.

Figures 1, 3B:
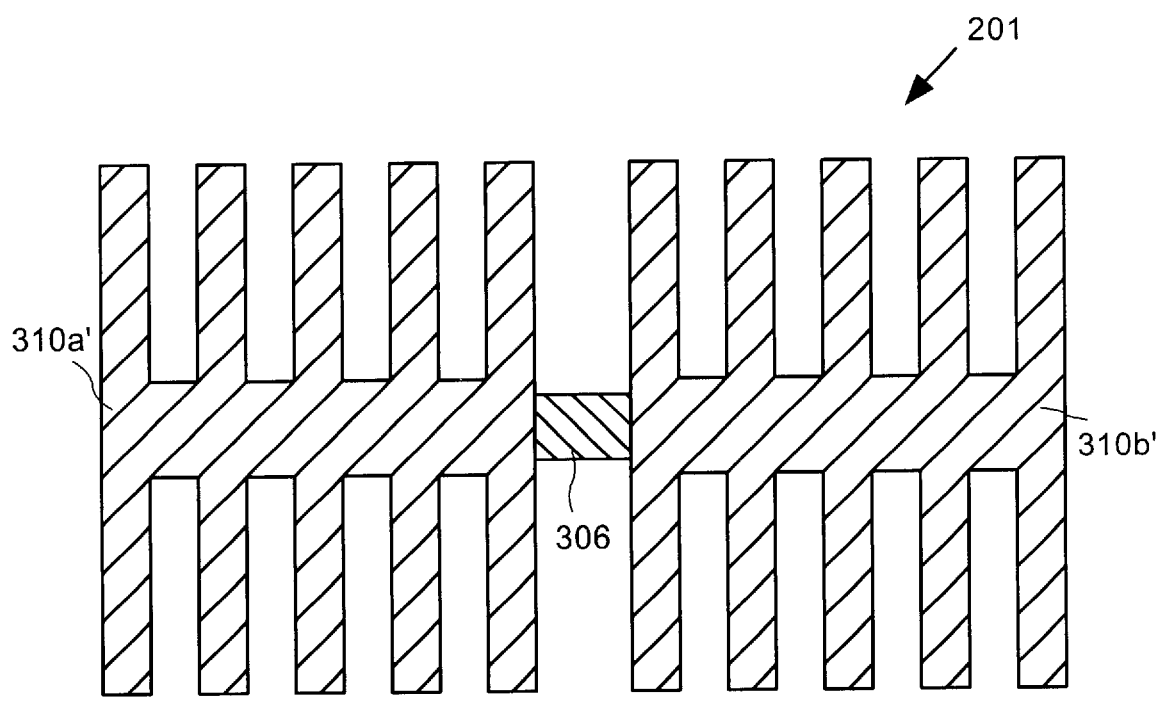
FIG. 3B—1 is a top view of one embodiment of the present invention.
Figures 2, 3B:
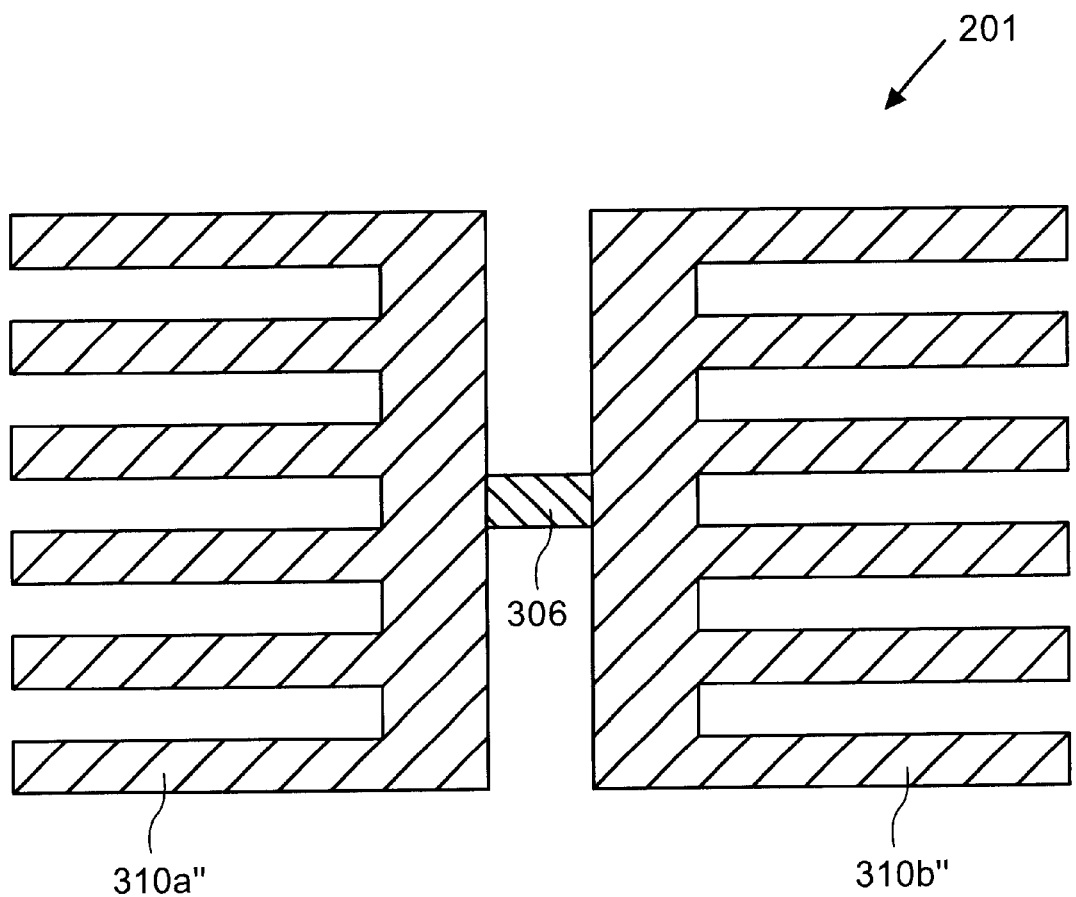

In FIG. 3B—2, the metallization lines 310"a and 310"b are also configured in a fork arrangement. Here, the metallization lines 310"a and 310"b are in the shape of fingers arranged in a fork pattern. Again, the fingers increase the peripheral surface area of the programming metallization lines 310"a and 310"b. The increased surface area provided by the configurations shown in FIGS. 3B—1 and 3B—2 increase the peripheral surface area of the programming metallization lines 310a and 310b. The increased area will facilitate positive charging of the metallization lines 310a and 310b during a plasma etch operation (not shown), thus increasing the rate at which via hole 213 forms according to FIG. 2D.

Figure 3C:
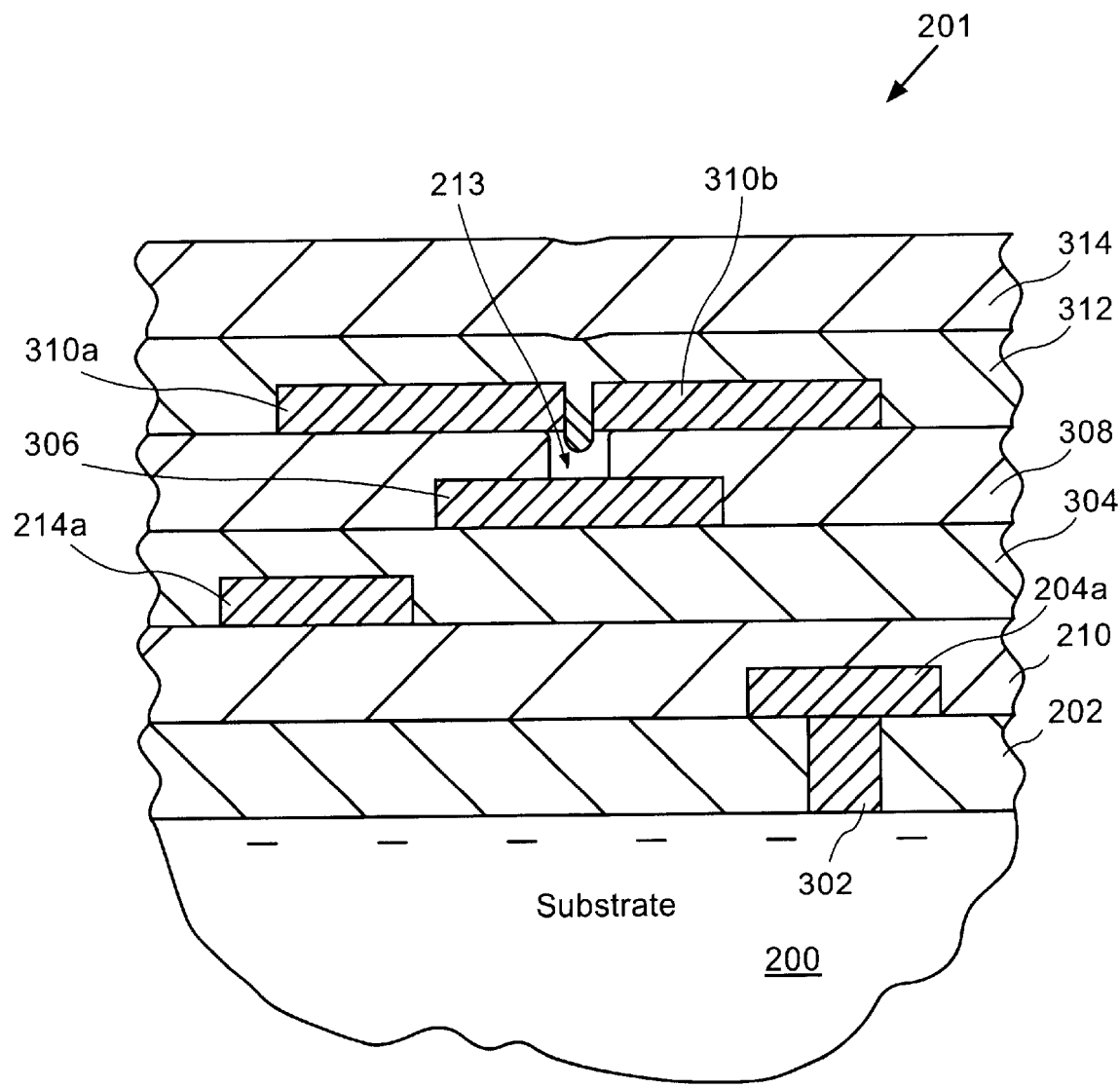
FIG. 3C depicts the semiconductor device with an oxide layer and a nitride layer formed over the programming metallization lines in accordance with one embodiment of the present invention.

FIG. 3C depicts the semiconductor device 201 having additional layers processed in accordance with one embodiment of the present invention. In this example, an oxide layer 312 is deposited over the programming metallization lines 310a and 310b, and then a nitride layer 314 (e.g., SiN) is deposited over the oxide layer 312. When the oxide layer 312 is formed over the programming metallization lines 310a and 310b, a portion of the oxide layer 312 will seep in between metallization lines 310a and 310b as shown. However, the region defined by via hole 213 remains after the oxide layer 312 is deposited. Once deposition of oxide layer 312 and nitride layer 314 is complete, patterned photoresist layer 316 is formed over the nitride layer 314 as shown in FIG. 3D.

Figure 3D:
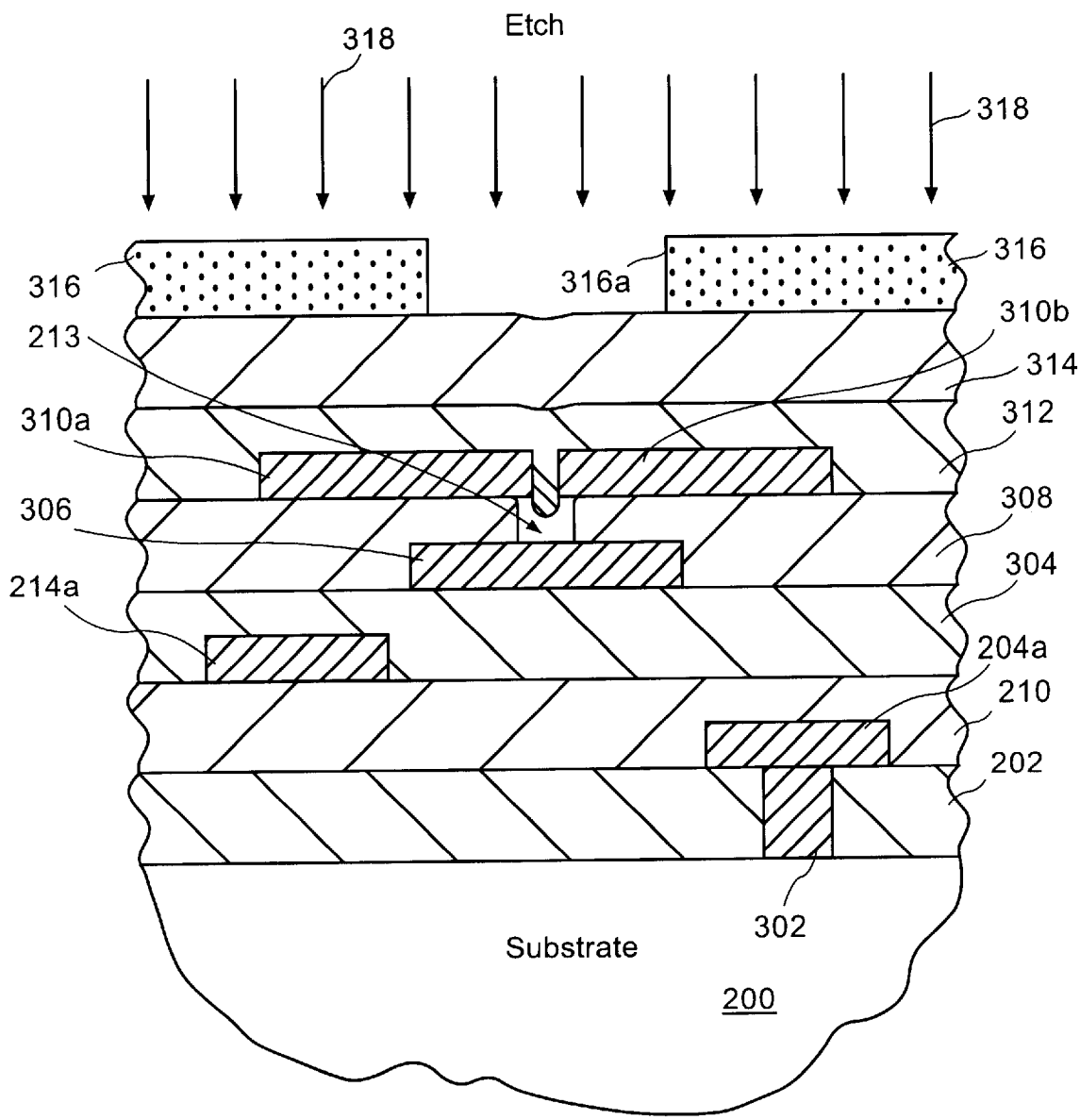
FIG. 3D shows a nitride etching operation being performed over a patterned photoresist mask on a semiconductor device in accordance with one embodiment of the current invention.

FIG. 3D shows a nitride etching operation 318 being performed over the patterned photoresist mask 316 on the semiconductor device 201. The photoresist layer 316 is patterned to define a window 316a which allows for etching down toward the programming metallization lines 310a and 310b. As is well known, the photoresist mask 316 may be patterned using any number of well known techniques, including conventional photolithography. Subsequent to the formation of the patterned photoresist layer 316, the nitride etch operation 318 is performed to remove the portion of the nitride layer 314 exposed by the photoresist layer 316 down to the oxide layer 312. The nitride layer 314 may be etched using any suitable etcher and etch chemistry that is configured to selectively etch nitride materials, such as silicon nitride.

Figure 3E:
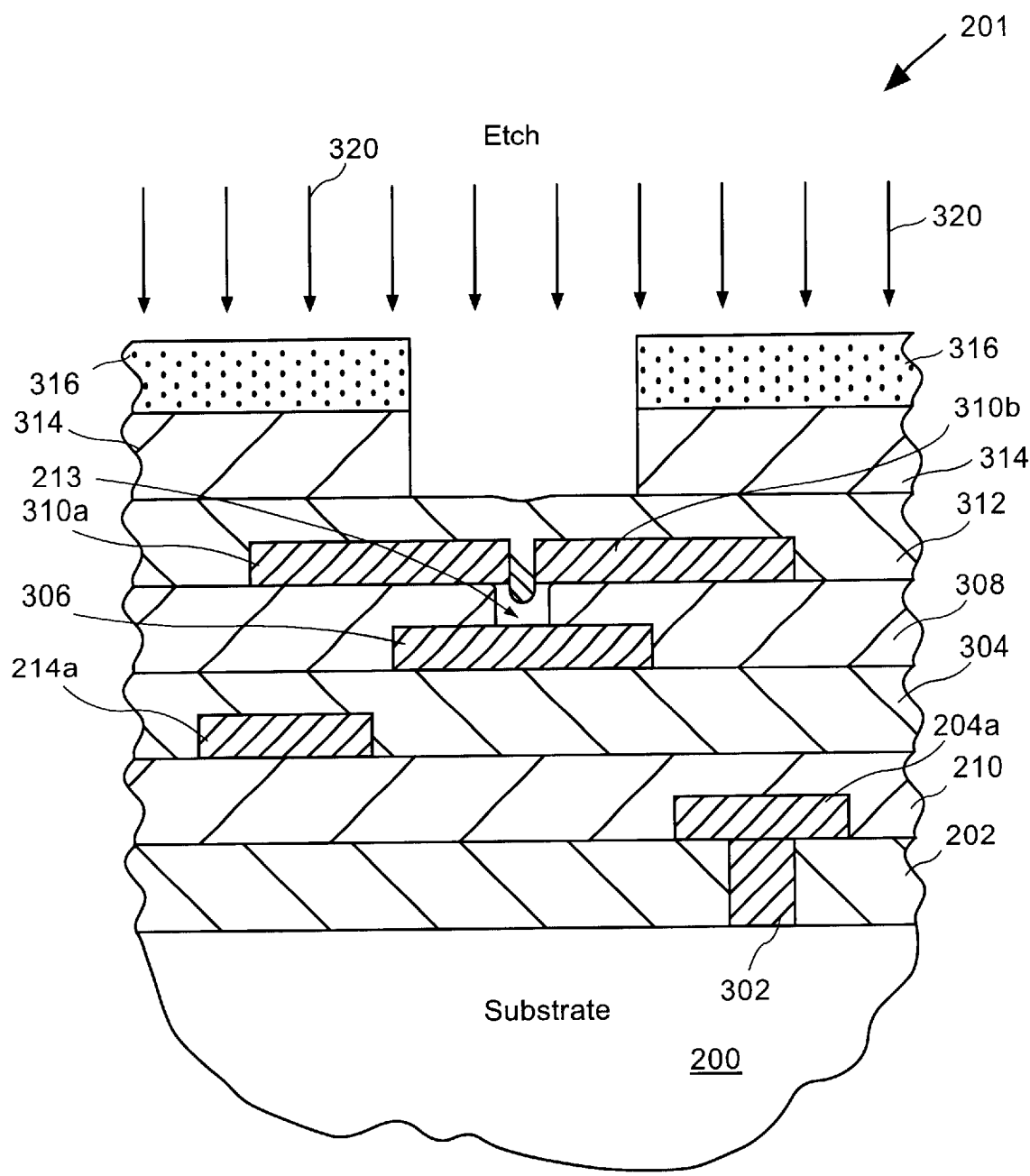
FIG. 3E demonstrates a semiconductor device being subjected to an oxide etch operation over a patterned photoresist mask in accordance with one embodiment of the current invention.

After the nitride etch operation 318 is complete, another etch operation 320 is performed as shown in FIG. 3E. FIG. 3E demonstrates the semiconductor device 201 being subjected to the oxide etch operation 320. The oxide etch operation 320 etches the oxide layer to form a thin layer of the oxide 312 over the programming metallization lines 310a and 310b, thus defining a laser contact location 321, as shown in FIG. 3F.

Figure 3F:
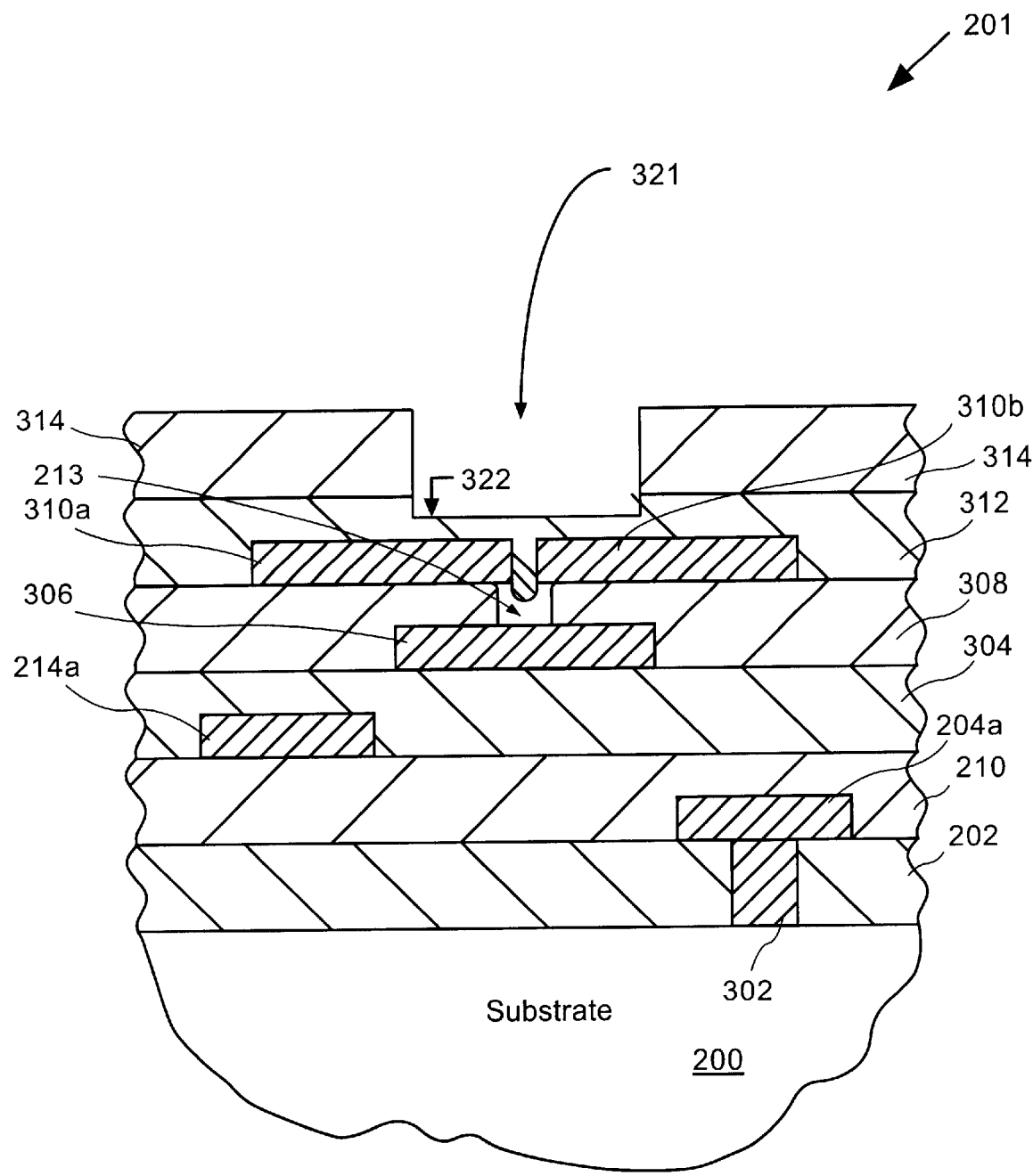
FIG. 3F shows the formation of the laser contact location once the etch operation is complete, in accordance with one embodiment of the current invention.

FIG. 3F shows the formation of the laser contact location 321 once the etch operation 320 is complete. The laser contact location 321 is defined within the nitride layer 314 and the oxide layer 312. A thin layer of the oxide 312 sits above the programming metallization lines 310a and 310b as illustrated in FIG. 3F. The thin layer of oxide 312 is defined by a thickness 322. In this embodiment, the oxide layer 312 is etched to the thickness 322 ranging between about 4000 Angstroms and about 8000 Angstroms, and more preferably about 6000 Angstroms.

Figure 4:
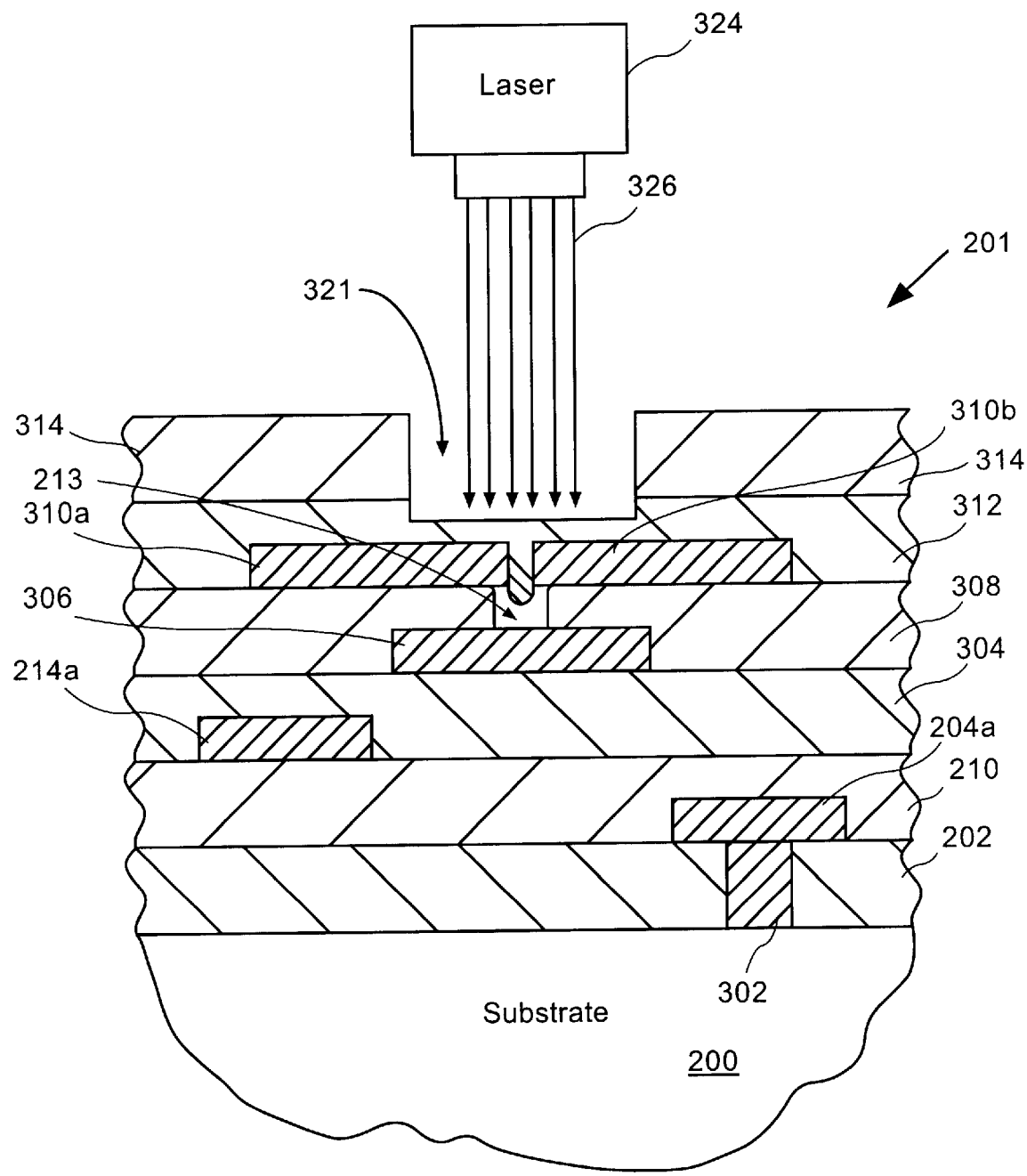
FIG. 4 depicts the application of laser energy to the semiconductor device, in accordance with one embodiment of the current invention.

The laser contact location 321 allows the application of a directed heat source to the programming metallization lines 310a and 310b to induce melting as shown in FIG. 4. FIG. 4 depicts the application of laser energy 326 to the semiconductor device 201. A laser 324 directs the laser energy 326 into the laser contact location 321. In one embodiment, the laser 324 can be a Spectra Physics diode pumped Q-switched laser (Nd:YLF) having a wavelength of about 1047 nm. Such a laser can be obtained from Spectra Physics, Inc. of Mountain View, Calif. The laser energy 326 is configured to heat the programming metallization lines 310a and 310b, causing at least a portion to melt into the via hole 213 and form a programming link 330, as illustrated in FIG. 5.

Figure 5:
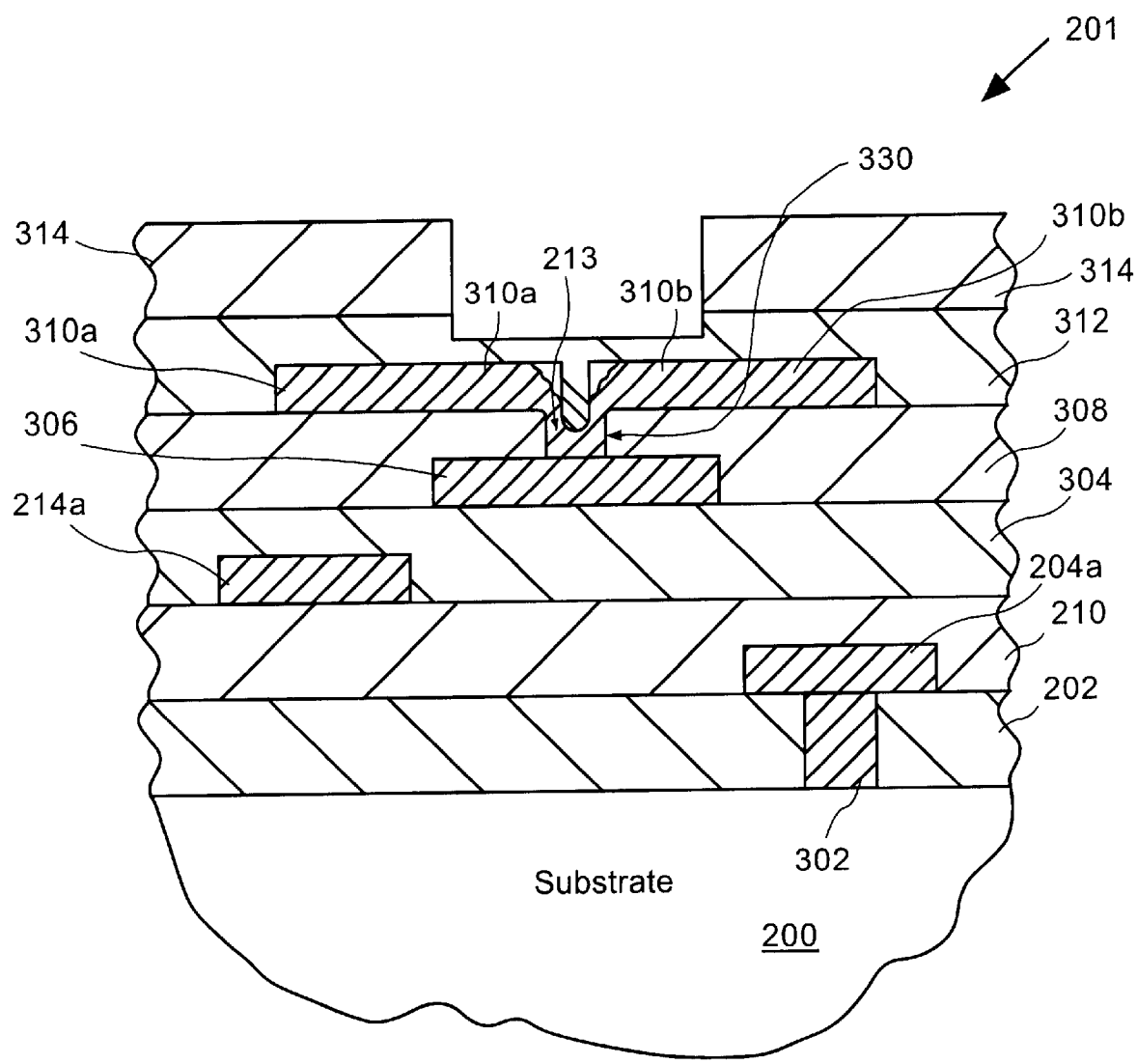
FIG. 5 illustrates the formation of a programming link, in accordance with one embodiment of the current invention.

FIG. 5 shows the formation of the programming link 330. The programming metallization lines 310a and 310b melt into the via hole 213. As the programming metallization lines 310a and 310b melt into the via hole 213, they come into contact with each other and the link metallization line 306 to form the programming link 330 within the semiconductor device 201.

The present invention allows for a more controlled manner of programming a semiconductor device. A direct heat source may be applied to the desired area for programming. Once the heat source is applied, the programmable metallization lines expand and melt into a via hole. The via hole allows expansion of the programmable metallization lines without causing stresses that produce cracks throughout the semiconductor device. Finally, the programming of a semiconductor device may be controlled by selectively applying a heat source to a given metallization line.

Thus, the previous problems associated with the expanding metallization lines in the prior art are circumvented with the present invention. When the prior art programmable structures were heated, the programmable lines expanded against the surrounding dielectric. The expansion caused undue stressing and cracking throughout the dielectric surrounding the melting metallization line. In the present invention, the via hole provides a path for the metallization line to melt into.

The programmable metallization lines are fabricated during normal interconnect process operations used to make semiconductor devices. As such, no extra process steps are necessary to fabricate the programmable metallization lines. In addition, this allows for a compact design and compact packaging of the programmable structure within the semiconductor device. The compact packaging gives a semiconductor device using this technology the capability of being compactly designed into any type of integrated circuit structure. Furthermore, the programmable lines may be implemented at any level in a semiconductor device during normal fabrication steps.

In other applications, the programmable structures of the present invention can be implemented in memory arrays. As is well known, memory arrays are typically fabricated along with redundant columns, that can be replaced for selected columns of the memory array when failures are detected during testing. Therefore, a test engineer can easily implement a laser when needed to complete the desired programming to cause such replacement and insure that the memory array will work as intended. It is also noted that no special programming fuses or antifuse devices are needed to perform the desired programming in such memory array applications. In addition, the formed links are more reliable than conventional fuse technology because the links actually represent hard-wired connections. In antifuse technology for example, formed links are not hard-wired links, and thus can become de-programmed over time.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making a programmable device comprising:

forming a link metallization line;

depositing an oxide layer over the link metallization line;

forming a conductive via in the oxide layer in communication with the metallization line;

forming a programming metallization line over the oxide layer such that an overlap portion of the programming metallization line lies over the conductive via;

removing a conductive material from the conductive via to define a via hole that forms a path between the programming metallization line and the link metallization line;

melting at least part of the overlap portion of the programming metallization line into the via hole to define a programming link connecting the link metallization line to the programming metallization line;

depositing an oxide layer over the programming metallization line such that the oxide layer does not fill the via hole; and depositing a nitride layer over the oxide layer.

2. A method for making a programmable device according to claim 1, wherein the operation of melting the overlap portion further includes:

applying laser energy to melt the overlap portion of the programming metallization line to form the programming link.

3. A method for making a programmable device according to claim 1, further comprising:

etching a laser contact location within the oxide layer and the nitride layer such that a thin portion of the oxide layer remains over the programming metallization line; and applying the laser energy which melts the programming metallization line to form the programming link within the laser contact location.

4. A method for making a programmable device according to claim 3, wherein the thin oxide layer has a thickness of between about 4,000 Å and about 8,000 Å.

5. A method for making a programmable device according to claim 1, wherein the operation of forming the programming metallization lines further includes:

patterning a plurality of fingers as part of the programming metallization line such that the fingers are in one of a fork arrangement and an opposing fork arrangement.

6. A method for making a programmable device according to claim 1, wherein the programming metallization lines have a thickness of between about 4,000 Å and about 20,000 Å.

7. A method for making a programmable device comprising:

forming a link metallization line;

depositing an oxide layer over the link metallization line;

forming a conductive via in the oxide layer which is in communication with the link metallization line;

patterning a programmable metallization line over the oxide layer to define an overlap portion of the programmable metallization line which at least partially overlaps the conductive via;

removing a conductive material within the conductive via to define a via hole which creates a path between the programming metallization lines and the link metallization lines;

forming a second oxide layer over the programmable metallization layer;

forming a nitride layer over the second oxide layer;

patterning the nitride layer and the second oxide layer such that a laser contact location is formed over the programmable metallization line and the via hole; and applying heat energy at the laser contact location such that the at least part of the overlap portion of the programmable metallization layer melts into the via hole and comes into contact with the link metallization layer to form a programmable link.

8. A method for making a programmable device according to claim 7, wherein the operation of applying the heat energy further includes:

applying laser energy to melt the at least part of the overlap portion of the programming metallization line.

9. A method for making a programmable device according to claim 7, wherein the operation of forming the laser contact location further includes:

patterning the second oxide layer such that a thin layer of oxide remains over the programming metallization layer.

10. A method for making a programmable device according to claim 9, wherein the thin oxide layer has a thickness of between about 4,000 Å and about 8,000 Å.

11. A method for making a programmable device according to claim 7, wherein the operation of patterning the programming metallization lines further includes:

defining a plurality of fingers as part of the programming metallization line whereby the fingers are in one of a opposing fork formation and a fork formation.

12. A method for making a programmable device according to claim 7, wherein the programming metallization lines have a thickness between about 4,000 Å and about 20,000 Å.

* * * * *